United States Patent
Sundaresh et al.

(10) Patent No.: US 11,663,681 B2
(45) Date of Patent: *May 30, 2023

(54) SYSTEM TO MAKE CONSUMERS AWARE OF ELECTRICITY USAGE

(71) Applicant: INNOVATION ASSETT COLLECTIVE, Waterloo (CA)

(72) Inventors: Nagaraja Sundaresh, Bangalore (IN); Pradeep Shetty, Bangalore (IN); Rajesh Ramesh, Bangalore (IN); Chandrashekar Padubidri, Bangalore (IN); Rangesa Arakere, Bangalore (IN); Ananda Huchappa Shastry, Bangalore (IN)

(73) Assignee: INNOVATION ASSET COLLECTIVE, Waterloo (CA)

( * ) Notice: Subject to any disclaimer, the term of this patent is extended or adjusted under 35 U.S.C. 154(b) by 0 days.

This patent is subject to a terminal disclaimer.

(21) Appl. No.: 17/545,917

(22) Filed: Dec. 8, 2021

(65) Prior Publication Data

US 2022/0101457 A1   Mar. 31, 2022

Related U.S. Application Data

(63) Continuation of application No. 15/625,867, filed on Jun. 16, 2017, now Pat. No. 11,227,345, which is a continuation of application No. 12/485,167, filed on Jun. 16, 2009, now Pat. No. 9,836,802.

(51) Int. Cl.
    *G06Q 50/06*    (2012.01)
    *G01R 22/10*   (2006.01)

(52) U.S. Cl.
    CPC ............. *G06Q 50/06* (2013.01); *G01R 22/10* (2013.01)

(58) Field of Classification Search
    CPC ................................ G06Q 50/06; G01R 22/10
    See application file for complete search history.

(56) References Cited

U.S. PATENT DOCUMENTS

| | | |
|---|---|---|
| 4,046,532 A | 9/1977 | Nelson |
| 4,341,345 A | 7/1982 | Hammer et al. |
| 4,345,162 A | 8/1982 | Hammer et al. |
| 4,389,577 A | 6/1983 | Anderson et al. |
| 4,577,977 A | 3/1986 | Pejsa |
| 4,644,320 A | 2/1987 | Carr et al. |
| 4,924,404 A | 5/1990 | Reinke, Jr. |
| 5,598,349 A | 1/1997 | Elliason et al. |
| 6,552,525 B2 | 4/2003 | Bessler |
| 6,574,581 B1 | 6/2003 | Bohrer et al. |
| 6,838,978 B2 * | 1/2005 | Aizu ................. H04B 3/54 700/24 |
| 6,931,445 B2 | 8/2005 | Davis |

(Continued)

OTHER PUBLICATIONS

Ecobee, Smart Thermostat Installation Manual, pp. 1-26, 2009.

(Continued)

*Primary Examiner* — Manuel A Rivera Vargas
*Assistant Examiner* — Yaritza H Perez Bermudez

(57) ABSTRACT

Energy usage of a plurality of appliances is measured using a single meter. A pattern of energy usage with respect to the plurality of appliances is determined dependent upon the measured energy usage, appliance details of the plurality of appliances, and usage hours of the plurality of appliances. The pattern is provided to a user of the appliances.

19 Claims, 9 Drawing Sheets

(56) References Cited

U.S. PATENT DOCUMENTS

| | | |
|---|---|---|
| 6,975,958 B2 | 12/2005 | Bohrer et al. |
| 7,058,524 B2 | 6/2006 | Hayes et al. |
| RE40,013 E | 1/2008 | Quinn |
| 7,346,467 B2 | 3/2008 | Bohrer et al. |
| 7,379,997 B2 * | 5/2008 | Ehlers .................. G06Q 50/06 |
| | | 702/182 |
| 7,392,115 B2 | 6/2008 | Schindler |
| 2001/0010032 A1 * | 7/2001 | Ehlers .................. G05B 19/042 |
| | | 702/62 |
| 2005/0060107 A1 * | 3/2005 | Rodenberg, III ...... G01D 4/006 |
| | | 702/62 |
| 2007/0271006 A1 * | 11/2007 | Golden ............. H02J 13/00026 |
| | | 700/295 |
| 2008/0011864 A1 | 1/2008 | Tessier et al. |
| 2008/0027885 A1 | 1/2008 | van Putten et al. |
| 2008/0228325 A1 | 9/2008 | Schindler |
| 2008/0238406 A1 | 10/2008 | Banhegyesi |
| 2009/0001180 A1 | 1/2009 | Siddaramanna et al. |
| 2009/0001181 A1 | 1/2009 | Siddaramanna et al. |
| 2009/0001182 A1 | 1/2009 | Siddaramanna et al. |
| 2009/0045804 A1 * | 2/2009 | Durling .................. G01D 4/008 |
| | | 324/140 R |
| 2009/0195349 A1 | 8/2009 | Frader-Thompson et al. |

OTHER PUBLICATIONS

Ecobee, Smart Thermostat User Manual, pp. 1-32, 2009.
Ecobee, Screenshot of Ecobee Web Site Window, Captured prior to Jun. 16, 2009.
Ecobee, "Meet the Ecobee Smart Thermostat," Sales Sheet, 2 pages, prior to Jun. 16, 2009.
http://www.ecobee.com/productspecifications, "Programmable Thermostats and Other Green Living Products—Specifications," 2 pages, 2009.

* cited by examiner

SYSTEM TO MAKE CONSUMERS AWARE OF ELECTRICITY USAGE

This application is a Continuation of U.S. patent application Ser. No. 15/625,867, filed Jun. 16, 2017, and entitled "System to Make Consumers Aware of Electricity Usage", which is a Continuation of U.S. patent application Ser. No. 12/485,167, filed Jun. 16, 2009, and entitled "System to Make Consumers Aware of Electricity Usage". U.S. patent application Ser. No. 12/485,167, filed Jun. 16, 2009, is incorporated herein by reference. U.S. patent application Ser. No. 15/625,867, filed Jun. 16, 2017, is incorporated herein by reference.

TECHNICAL FIELD

The technical field of the present application relates to making end consumers aware of their electricity usage.

BACKGROUND

In order to make energy consumers such as home owners aware of the energy usage of their various appliances, information regarding energy usage is often provided to the energy consumers. It is hoped that this awareness will help energy consumers to avoid energy waste in operating their appliances.

Measurement equipment could, of course, be installed for each of the consumer's energy consuming appliances, or least for each of the consumer's major energy consuming appliances. Outputs from such equipment could then be used to inform the consumers of the energy usage of their appliances. However, such equipment adds extra cost for each of the appliances being monitored.

Moreover, it is also desirable to install communication equipment in order to communicate the energy consumption of the various appliances to a central module where the energy awareness information related to the appliances can be calculated and presented to the consumer. However, if energy measuring equipment is used for each appliance, providing communication equipment for each energy measuring equipment results in even more cost.

Disclosed herein is an energy awareness system which avoids the addition of energy measurement equipment at each of the appliances to be monitored for energy awareness.

Instead, the energy awareness system adds only one energy measurement equipment at the mains of the building or house. The awareness system, for example, may be arranged to poll the energy measurement equipment at the mains in order to fetch the energy consumption at the mains, and may further be arranged to use this energy consumption data and profiles of each of the appliance within the building or house to infer the consumption for each appliance.

BRIEF DESCRIPTION OF THE DRAWINGS

Features, aspects, and advantages of the present invention will become better understood when the following detailed description is read with reference to the accompanying drawings in which.

DETAILED DESCRIPTION

Figure 1:
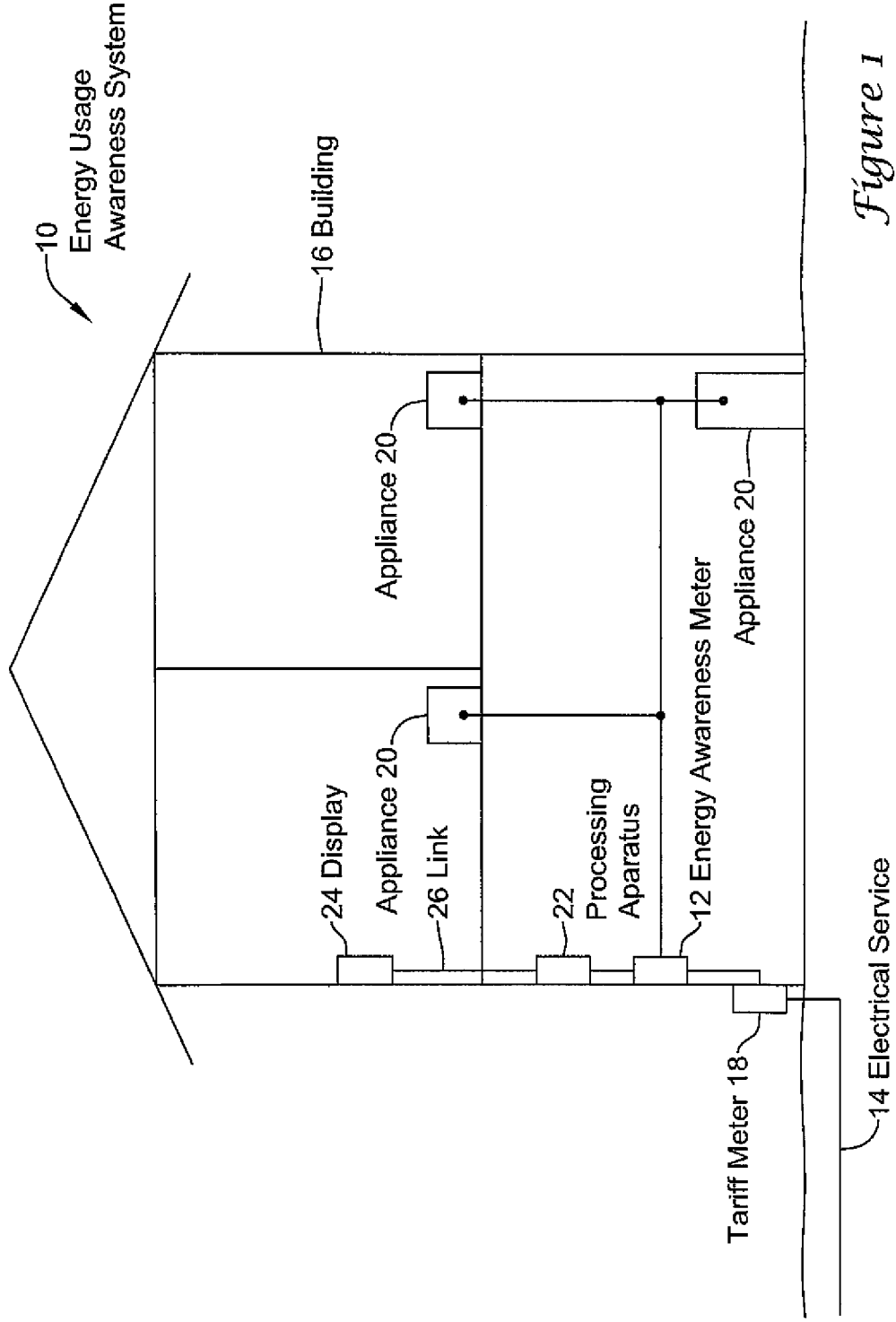
FIG. 1 illustrates an example of an energy awareness system.

As shown in FIG. 1, an energy usage awareness system 10 includes an energy awareness meter 12 that is coupled in an electrical service 14 of a facility or building 16 downstream of an electric company's tariff meter The energy awareness meter 12, for example, may be a digital meter, and the building 16, for example, may be a residence such as a house. However, the energy awareness meter 12 may be other than a digital meter, and the building 16 may be other than a residence. The electric company's tariff meter 18 supplies energy usage information that is used for billing purposes by the electric company providing the electrical service 14 to the building 16.

The energy awareness meter 12 measures the energy used by a plurality of appliances 20 within the building 16 on a periodic basis, such as once a minute, to provide the measured energy usage information with a fine level of granularity. Thus, the granularity of the energy consumption measurements is at the minute by minute level. However, the energy awareness meter 12 may measure the energy consumed by the appliances 20 within the building 16 on a periodic basis other than once a minute, or the energy awareness meter 12 may measure the energy consumed by the appliances 20 within the building 16 on a non-periodic basis.

The energy usage awareness system 10 also includes a processing apparatus 22. The energy awareness meter 12 communicates the measured energy usage information to the processing apparatus 22 as soon as the energy awareness meter 12 acquires the measured energy usage information. Alternatively, the energy awareness meter 12 may be arranged to store the measured energy usage information over a predetermined amount of time, such as hourly, and then communicate the stored information hourly to the processing apparatus 22. The processing apparatus 22 maintains the granularity of the energy usage measured by the energy awareness meter 12.

The processing apparatus 22 may be provided locally within the building 16. For example, the processing apparatus 22 may be located at the energy awareness meter 12. In this case, the processing apparatus 22 and the energy awareness meter 12 may be contained within the same housing or separate housings.

Alternatively, the processing apparatus 22 may be located within the building 16 but remotely from the energy awareness meter 12. In this case, the processing apparatus 22 may be located so as to provide convenient access to the occupant(s) of the building 16.

As a further alternative, the processing apparatus 22 may be provided remotely from the building 16. In this case, at least a display 24 of the processing apparatus 22 is located within the building 16 to provide energy awareness information to its occupant(s). However, instead of providing the energy awareness information to the occupant(s) of the building 16 by use of the display 24 associated with the processing apparatus 22, the energy awareness information can be otherwise provided to the occupant(s) of the building 16 such as by use of e-mail or postal mail.

The energy awareness meter 12 may be coupled to the processing apparatus 22 by a link 26. For example, the link 26 may be a wire link. A wire link may be most convenient in the case where the energy awareness meter 12 and the processing apparatus 22 are located proximate to one another. Alternatively, the link 26 may be a wireless link. A wireless link may be most convenient in the case where the processing apparatus 22 is located remotely from the building 16 at which the energy awareness meter 12 is used. In the case where the energy awareness meter 12 and the processing apparatus 22 are located remotely from one another but both within the building 16, the link 26 may be either a wire link or a wireless link to couple the energy awareness meter 12 and the processing apparatus 22.

Figure 2:
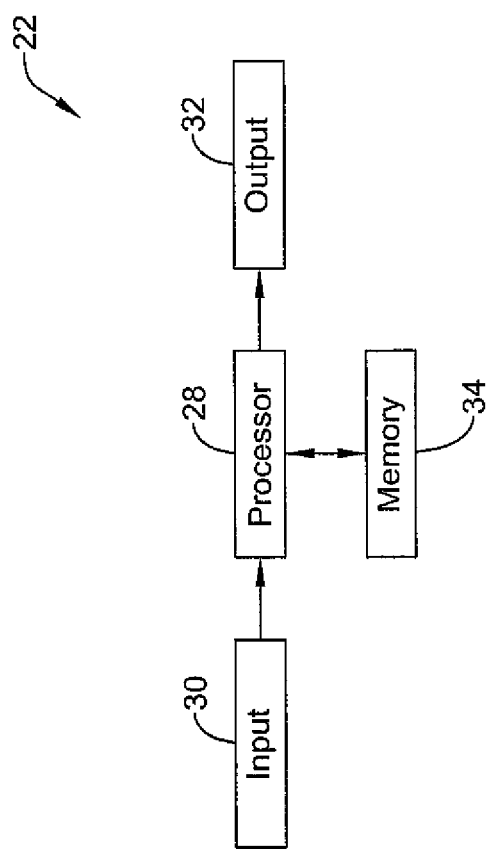
FIG. 2 illustrates processing equipment that can be used in the energy awareness system of FIG. 1.

As shown in FIG. 2, the processing apparatus 22, for example, includes a processor 28 such as computer, an input 30, an output 32, and a memory 34.

The input 30 may include one or more input devices such as a mouse, a keyboard, etc. capable of inputting data to the processor 28. The input 30 may be used to input data. This data may be stored in the memory 34 or may be used directly by the processor 28.

The output 32 may include one or more output devices such as a monitor, a printer, etc. The monitor of the output 32 may or may not comprise the display 24.

The memory 34 stores data such as input data, energy measurement data, and/or output data. The memory 34 may also store programming for operating the processor 28 and for providing the energy awareness information as described herein.

The occupant(s) of the building 16 provides appliance details and hours of usage regarding the use of each electrical appliance on typical days such as workdays, holidays, and weekends. This input is provided by use of the input 30 and is stored in the memory 34 or elsewhere. The processor 28 may lead the occupant(s) through the input of this data by way of suitable displays on the output 32.

The appliance details includes, for example, the rating and type of each of the electrical appliances. These electrical appliances are, for example, dishwashers, clothes washers, clothes dryers, air conditioners, electric heaters, hot water heaters, etc.

Figure 3:
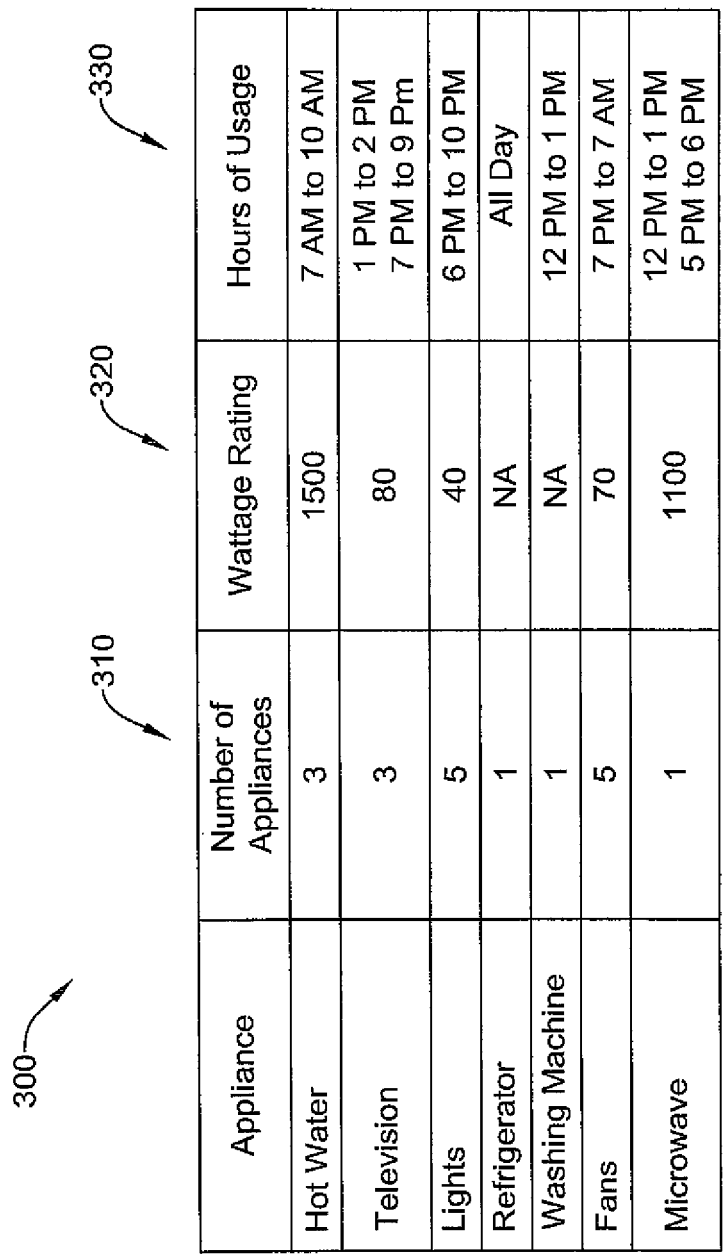
FIG. 3 illustrates an example of table containing appliance details and usage hours stored in memory of the energy awareness system of FIG. 1.

FIG. 3 is a table showing an example of appliance details and usage hours stored in the memory 34. Based on this table, certain inferences about the power consumed by the appliances in a building can be made from the actual overall power consumption as measured by the energy awareness meter 12.

Figure 4:
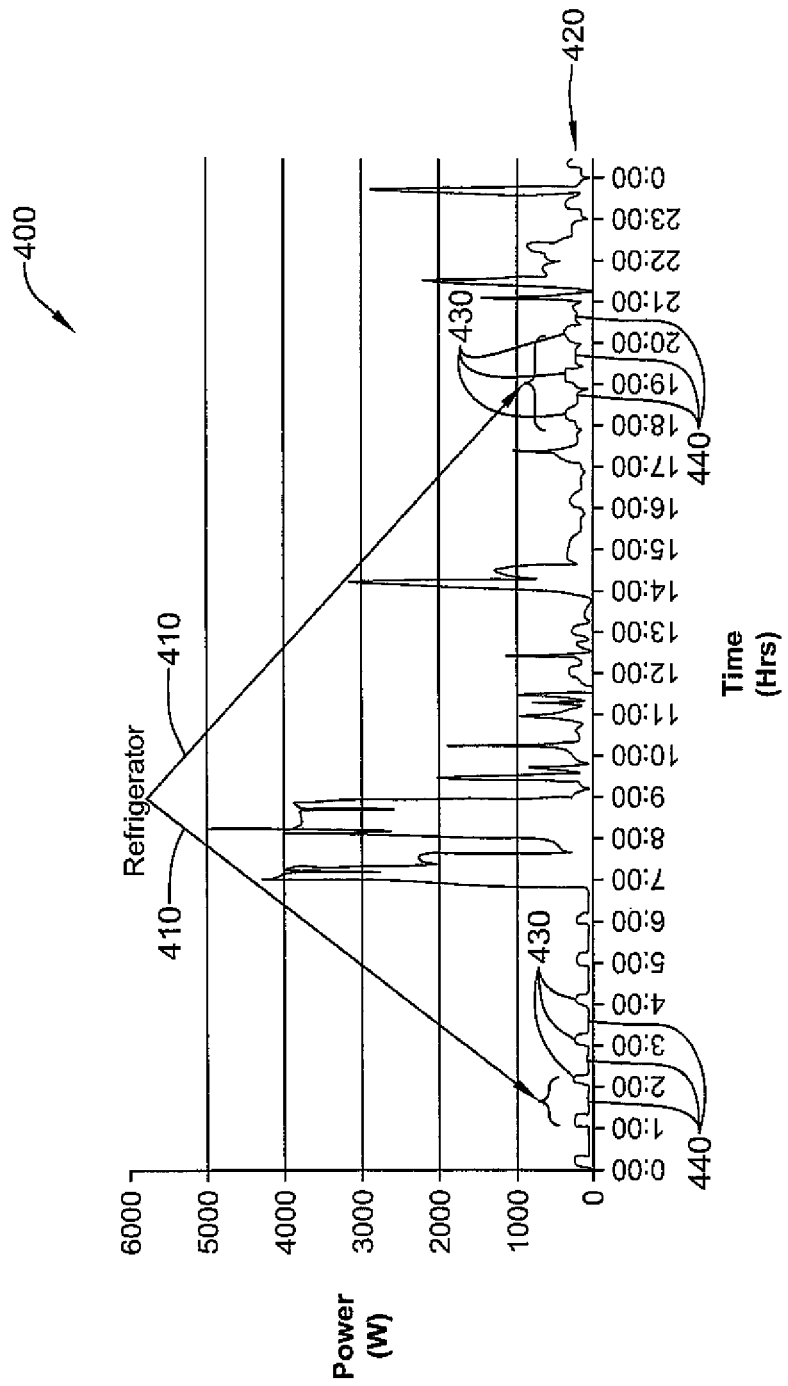
FIGS. 4-7 are graphs showing example inferences that can be made based on power consumption measured by a single energy awareness meter.

The graph of FIG. 4 shows by way of example the overall energy consumption by the appliances of a building as measured by the energy awareness meter 12. The graph of FIG. 4 specifically points outs the inference that can be made as to the power consumed by a refrigerator. This inference is based on the table of FIG. 3 and the building energy consumption as measured by the energy awareness meter 12. Although a refrigerator is turned "on" all of the time, its compressor actually cycles "on" and "off" at a rate that depends on a number of factors. These factors include how well the refrigerator is insulated, room temperature, freezer temperature, how often the door is opened, cleanliness of the evaporator coils, defrosting regularity, and the condition of door seals. It is assumed for purposes of FIG. 4 that the refrigerator cycles approximately 15 minutes on and 45 minutes off. Also, the refrigerator continues to draw a small amount of power even when it is switched "off" The graph of FIG. 4 shows that the "on" and "off" cycles exist throughout the day.

Figure 5:
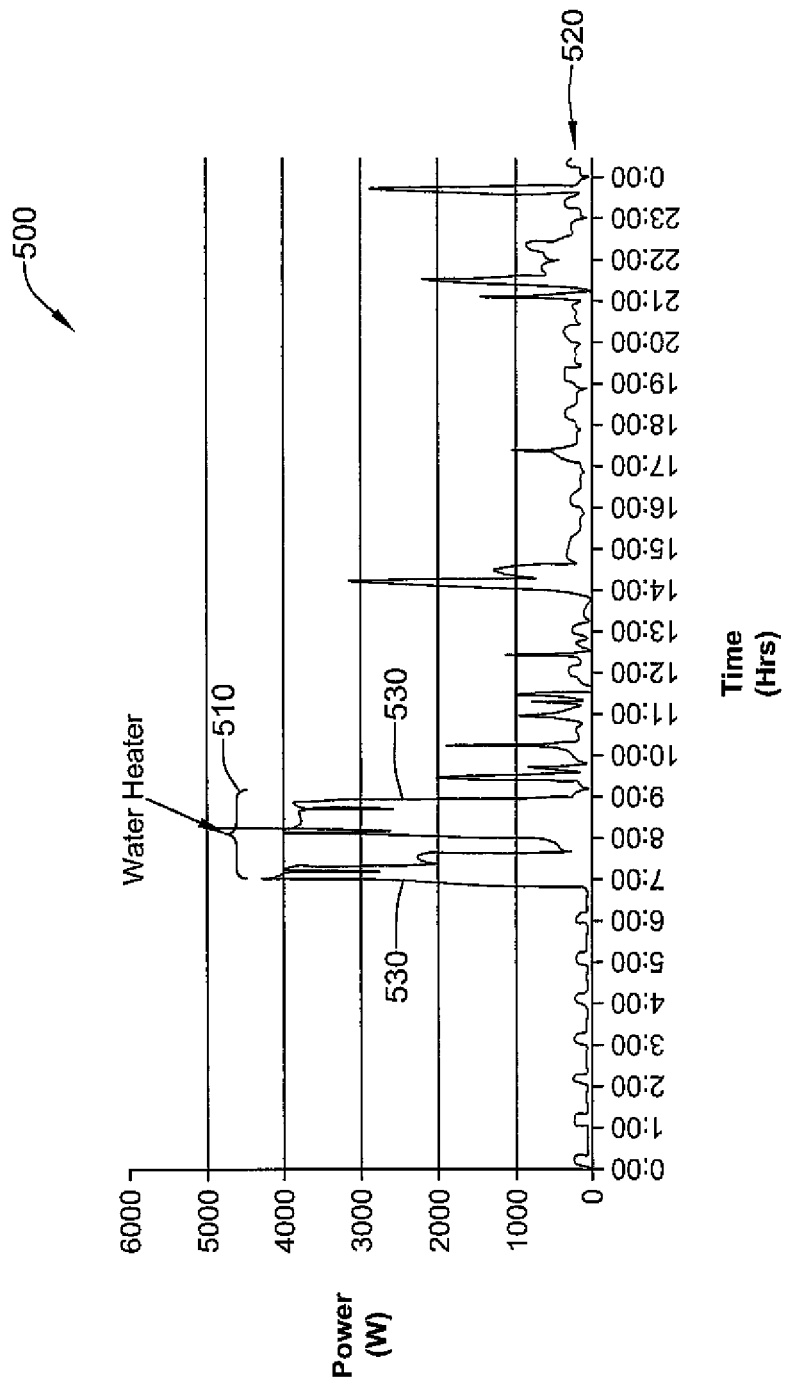

The graph of FIG. 5 specifically points outs the inference that can be made as to the power consumed by water heaters. Again, this inference is based on the table of FIG. 3 and the building energy consumption as measured by the energy awareness meter 12. The graph of FIG. 5 specifically points out the inferred contribution of two hot water heaters to the overall energy consumption measured by the energy awareness meter 12. The hot water heaters in this example each has a rating of 1500 watts and above. This graph shows that the two hot water heaters are "on" primarily between 7:00 AM and 9:00 AM.

Figure 6:
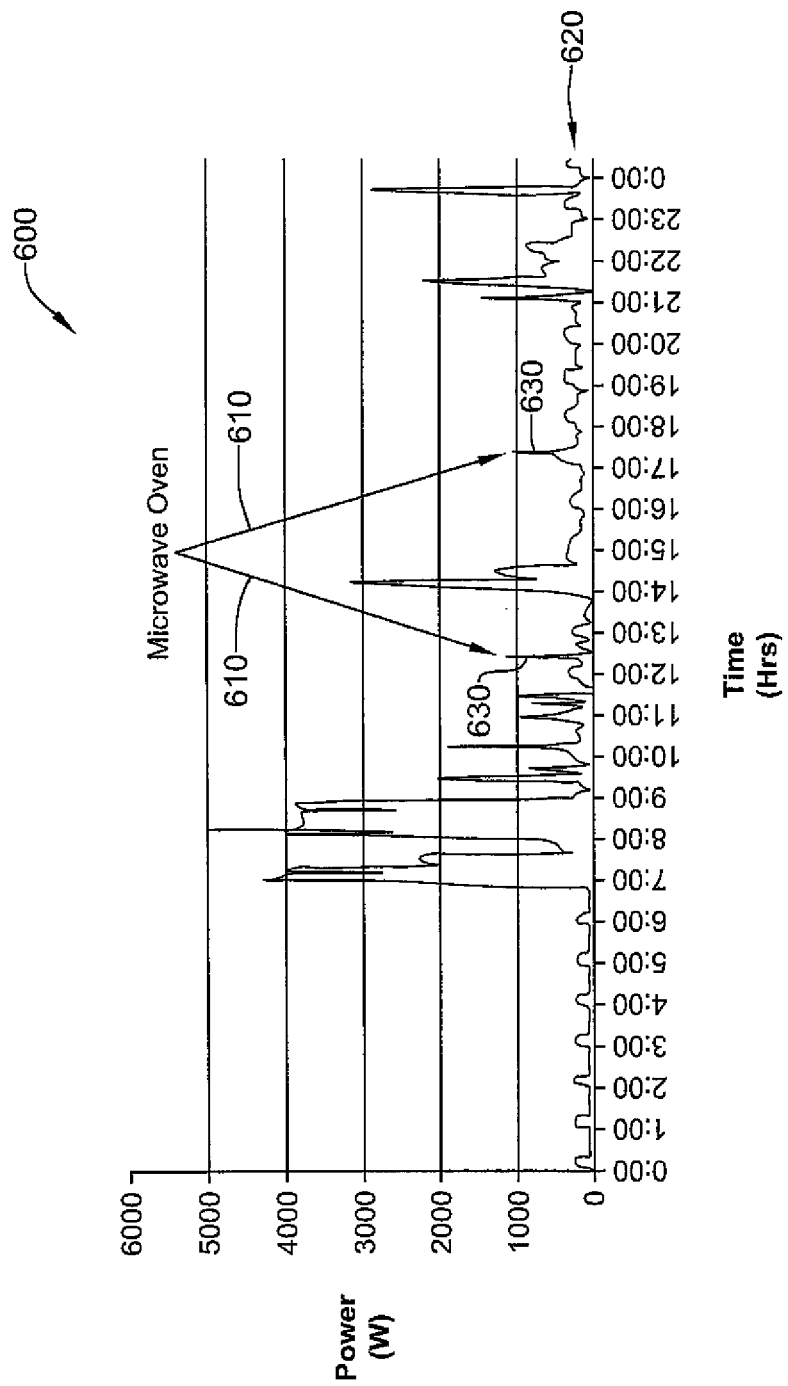

The graph of FIG. 6 specifically points outs the inference that can be made as to the power consumed by a microwave oven. This inference is likewise based on the table of FIG. 3 and the building energy consumption as measured by the energy awareness meter 12. The microwave oven in this example has a rating of 1100 watts. The microwave is on for a short duration, typically 1 to 3 minutes. The graph of FIG. 6 shows the two short duration spikes corresponding to microwave oven usage.

Figure 7:
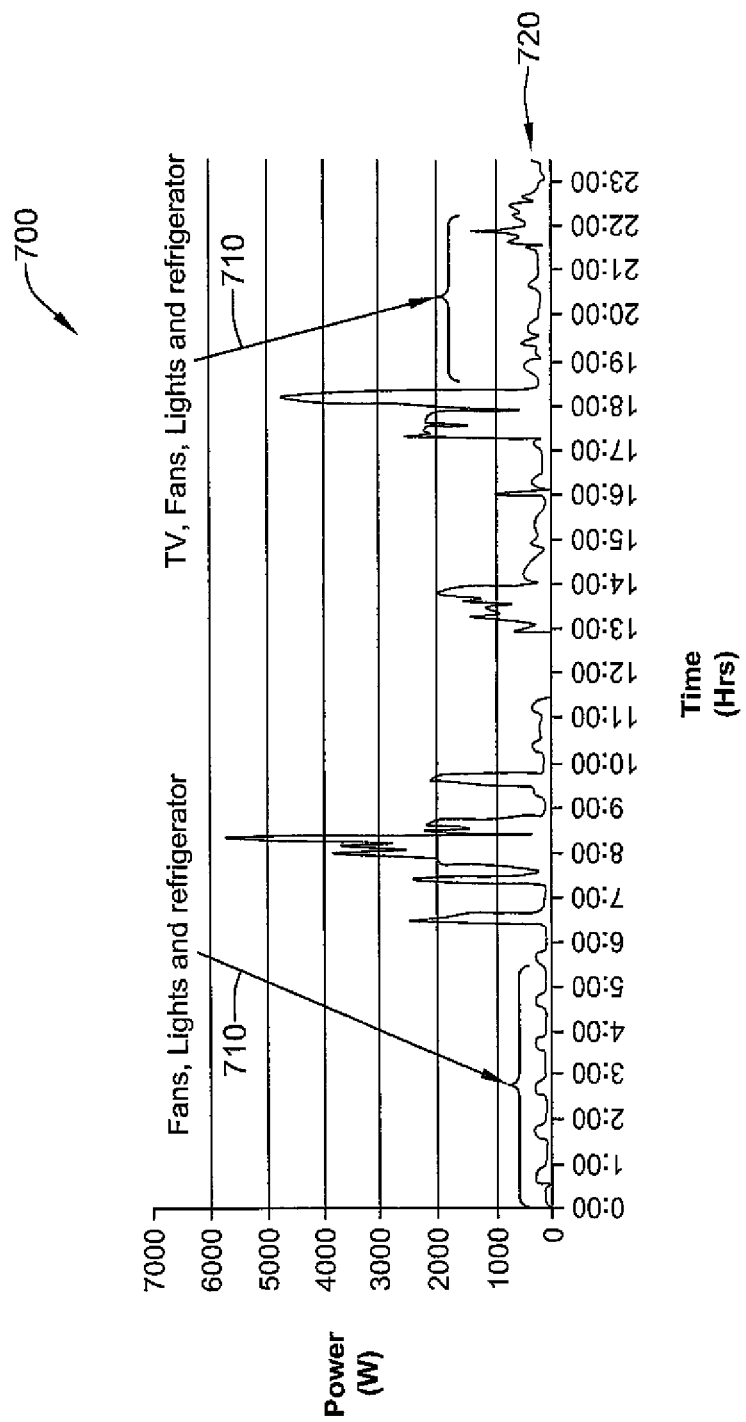

The graph of FIG. 7 specifically points outs the inference that can be made as to the power consumed by fans, lights, and the refrigerator. This inference is based on the table of FIG. 3 and the building energy consumption as measured by the energy awareness meter 12.

Each time the energy awareness meter 12 measures energy usage within the building 16, the processing apparatus 22 refers to the appliance details and usage hours stored in the memory 34 in order to infer which appliance is being used.

Figure 8:
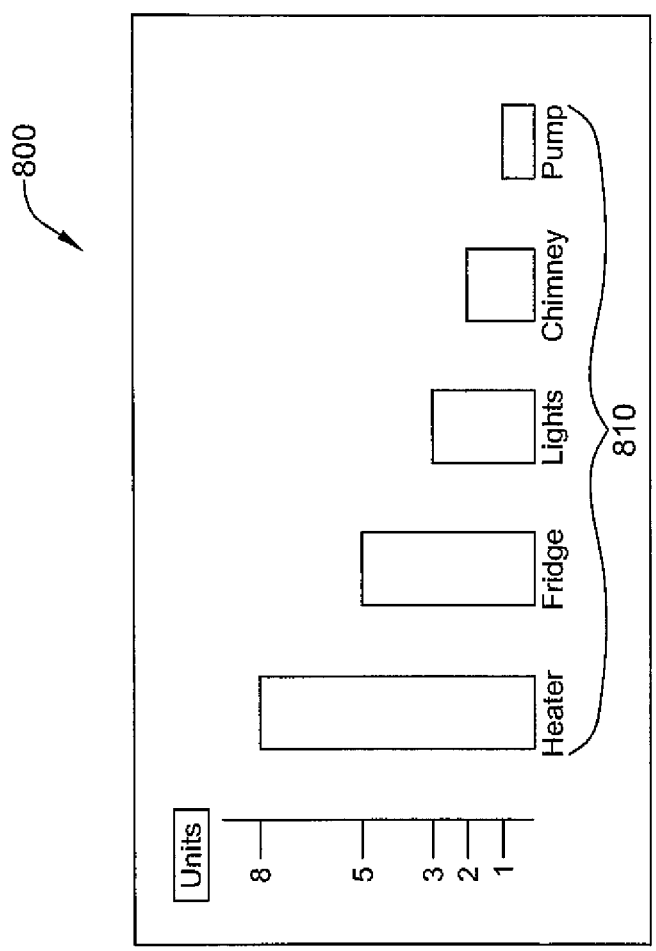
FIG. 8 illustrates an example of an energy consumption report that may be provided to occupant(s) of a building in which the energy awareness system of Figure lis deployed; and, FIG. 9 is a flow chart of an example program that can be executed to create the report of FIG. 8.

The processing apparatus 22 assembles this inferred energy usage information into a report such as shown in FIG. 8 to make the occupant(s) aware of the energy consumption of the various appliances within the building 16. This report, for example, shows the energy usage pattern for the appliances of the building 16. As indicated above, this report may be displayed on the display 24, may be e-mailed to the occupant(s), or may be postal mailed to the occupant(s).

Accordingly, energy consumption awareness information may be provided for some or all of the appliances of a building by use of a single energy awareness meter.

Figure 9:
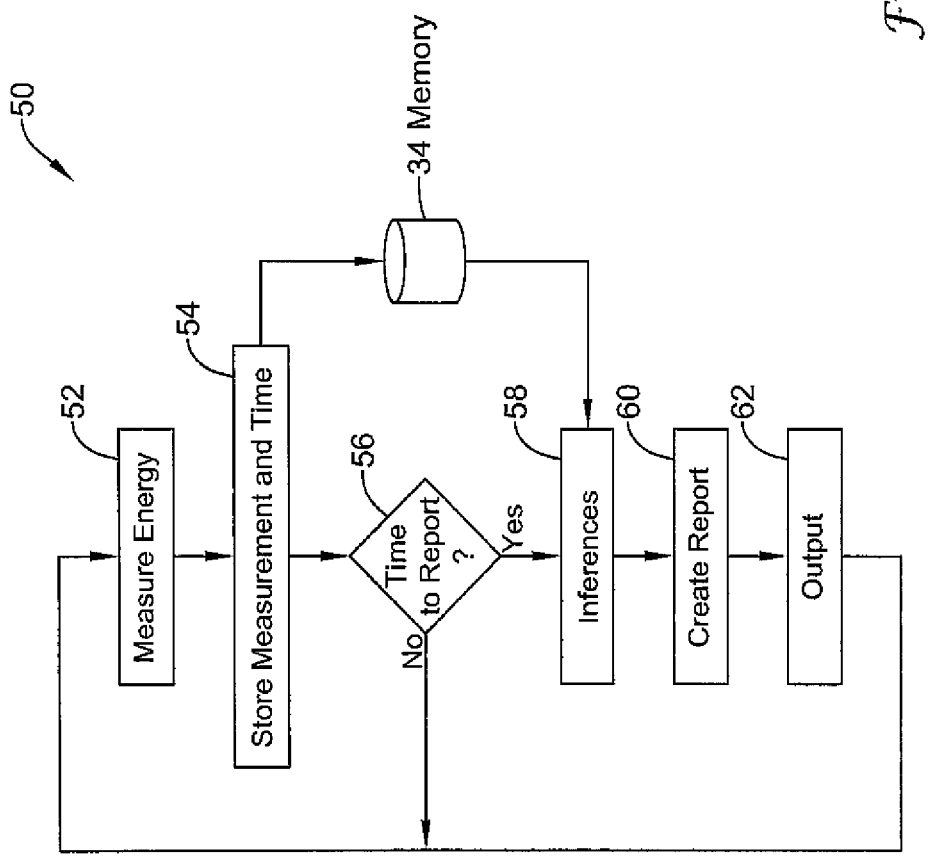

FIG. 9 if a flow chart illustrating a program 50 that may be stored in the memory 34 and executed by the processor to produce the power consumption reports by appliance even though only a single measurement device is used as discussed above.

At 52 of the program 50, the power consumption of the facility or building 16 as measured by the energy awareness meter 12 is read. At 54, the power consumption read at 52 and the time of the reading is stored in the memory 34. As indicated above, the granularity of the readings may be on a minute by minute basis. In this case, the output of the energy awareness meter 12 is read at 52 and is stored at 54 each minute. However, any other suitable level of granularity can be used.

At 56, a determination is made as to whether it is time to report appliance by appliance power consumption. Such a report may be made daily or on any other desired basis. If it is not time to report, program flow returns to 52 for additional measurements. If it is time to report, appliance by appliance inferences are made at 58 based on the table of FIG. 3 that is stored in the memory 34 and the measurements that are read at 52 and are stored in the memory 34 at 54. At 60, an appliance by appliance power consumption report such as shown in FIG. 8 is created based on these inferences. At 62, this report is provided as an output. For example, the report may be provided on the output 32 such as by way of a displayed and/or printed report.

Certain modifications of the present invention have been discussed above. Other modifications of the present invention will occur to those practicing in the art of the present invention.

For example, the energy usage awareness system 10 has been described above in connection with making building occupant(s) of their electrical energy usage patterns. However, the energy usage awareness system 10 can be used to make building occupant(s) of their patterns of using other forms of energy such as gas. If the energy usage awareness system 10 is used to make building occupant(s) of their gas usage patterns, the energy awareness meter 12 would be arranged to measure gas flow at the main input to the building 16, and the memory 34 stores appliance details includes, for example, the rating and type of each of the gas appliances. These gas appliances are, for example, dishwashers, clothes washers, clothes dryers, hot water heaters, and/or other gas consuming appliances.

As another example, the building 16 may be a residence, a factory, an office building, a warehouse, or any other structure or enclosure or otherwise within which plural appliances are used.

Consequently, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

What is claimed is:

1. An energy usage awareness system comprising:
   a device configured to receive and store device information about one or more energy consuming devices within a building, the device information comprising:
      one or more of:
         (i) a type of each of the one or more energy consuming devices;
         (ii) a number of the one or more energy consuming devices of each type within the building;
         (iii) ratings information for each of the one or more energy consuming devices; or
         (iv) a listing of typical hours of usage during a typical day for each of the one or more energy consuming devices;
   a single energy awareness meter that measures a sampled power magnitude at a mains of the building at specified intervals and for specified durations of time and stores the sampled power magnitudes;
   a memory that stores the device information about the one or more energy consuming devices within the building and the sampled power magnitudes;
   a processor coupled to the single energy awareness meter and to the memory, wherein the processor infers an energy usage pattern for the one or more energy consuming devices using the sampled power magnitudes of the building and the device information; and
   a display configured to display energy usage patterns for the one or more energy consuming devices.

2. The system of claim 1, wherein the device is within the building.

3. The system of claim 1, wherein the device is not within the building.

4. The system of claim 1, wherein:
   the single energy awareness meter is coupled to a tariff meter; and
   the tariff meter is coupled to an electrical service providing electricity to a building for the one or more energy consuming devices.

5. The system of claim 4, wherein the display displays the energy usage patterns provided by the processor.

6. The system of claim 1, wherein the display is located to be viewable by a user or users of the one or more energy consuming devices, but remotely from the single energy awareness meter.

7. The system of claim 1, wherein the processor is coupled to the single energy awareness meter by a link.

8. The system of claim 7, wherein the processor is coupled to the single energy awareness meter by a wired link.

9. The system of claim 7, wherein the processor is coupled to the single energy awareness meter by a wireless link.

10. An energy usage awareness system comprising:
    an energy awareness meter downstream of a building tariff meter, the energy awareness meter configured to sample a mains power consumed by one or more energy consuming devices within a building and to store the sampled power consumed, wherein the sampled power is stored as discrete samples of the mains power consumed within the building at specified intervals and for a specified duration of time; and
    a processing apparatus coupled to the energy awareness meter, the processing apparatus comprising:
       a memory for storing input information, wherein the input information comprises:
          one or more of:
             (i) a type of each of the one or more energy consuming devices;
             (ii) a number of the one or more energy consuming devices of each type within the building;
             (iii) ratings information for each of the one or more energy consuming devices; or
             (iv) a listing of typical hours of usage during a typical day for each of the one or more energy consuming devices;
       a processor, wherein the processor infers an energy usage pattern for each of the one or more energy consuming devices using the sampled power consumed within the building and the input information; and
       a display configured to display the energy usage pattern.

11. The energy usage awareness system of claim 10, comprising a wireless link between the energy awareness meter and the processing apparatus.

12. The energy usage awareness system of claim 10, comprising a wired link between the energy awareness meter and the processing apparatus.

13. The energy usage awareness system of claim 10, wherein the processing apparatus is located within the building.

14. The energy usage awareness system of claim 10, wherein the processing apparatus is not located within the building.

15. The energy usage awareness system of claim 10, wherein the processing apparatus is located within the energy awareness meter.

16. The energy usage awareness system of claim 10, wherein the processing apparatus is not located within the energy awareness meter.

17. The energy usage awareness system of claim 10, wherein:
the memory stores programming for operating the processor; or
the memory stores the energy usage pattern.

18. The energy usage awareness system of claim 10, wherein:
the processor is configured to prepare and the display is configured to display energy consumption by device type; or
the processor is configured to prepare a printed report.

19. An energy usage awareness system comprising:
a device configured to receive and store device information about one or more energy consuming devices within a building, the device information comprising:
a type of each of the one or more energy consuming devices;
a number of the one or more energy consuming devices of each type within the building;
ratings information for each of the one or more energy consuming devices; and
a listing of typical hours of usage during a typical day for each of the one or more energy consuming devices;
a single energy awareness meter that measures a sampled power magnitude at a mains of the building at specified intervals and for specified durations of time and stores the sampled power magnitudes;
a memory that stores the device information about the one or more energy consuming devices within the building and the sampled power magnitudes;
a processor coupled to the single energy awareness meter and to the memory, wherein the processor infers an energy consumption of the one or more energy consuming devices using the sampled power magnitudes of the building and the device information, wherein the processor is configured to cause the inferred energy consumption to be displayed and/or provided to a tariff meter.

* * * * *

UNITED STATES PATENT AND TRADEMARK OFFICE
CERTIFICATE OF CORRECTION

PATENT NO. : 11,663,681 B2
APPLICATION NO. : 17/545917
DATED : May 30, 2023
INVENTOR(S) : Nagaraja Sundaresh et al.

It is certified that error appears in the above-identified patent and that said Letters Patent is hereby corrected as shown below:

On the Title Page

Item (71) Applicant, should read:
INNOVATION ASSET COLLECTIVE

Signed and Sealed this
Fourteenth Day of November, 2023

*Katherine Kelly Vidal*

Katherine Kelly Vidal
*Director of the United States Patent and Trademark Office*